United States Patent
Hashigami

(10) Patent No.: US 12,180,585 B2
(45) Date of Patent: Dec. 31, 2024

(54) METHOD FOR PRODUCING GALLIUM PRECURSOR AND METHOD FOR PRODUCING LAMINATED BODY USING THE SAME

(71) Applicant: SHIN-ETSU CHEMICAL CO., LTD., Tokyo (JP)

(72) Inventor: Hiroshi Hashigami, Annaka (JP)

(73) Assignee: SHIN-ETSU CHEMICAL CO., LTD., Tokyo (JP)

( * ) Notice: Subject to any disclaimer, the term of this patent is extended or adjusted under 35 U.S.C. 154(b) by 0 days.

(21) Appl. No.: 17/766,467

(22) PCT Filed: Jul. 15, 2020

(86) PCT No.: PCT/JP2020/027420
§ 371 (c)(1),
(2) Date: Apr. 4, 2022

(87) PCT Pub. No.: WO2021/079571
PCT Pub. Date: Apr. 29, 2021

(65) Prior Publication Data
US 2024/0102159 A1 Mar. 28, 2024

(30) Foreign Application Priority Data
Oct. 24, 2019 (JP) .................................. 2019-193265

(51) Int. Cl.
| | | |
|---|---|---|
| C23C 16/44 | (2006.01) |
| C01G 15/00 | (2006.01) |
| C23C 16/40 | (2006.01) |
| C23C 16/448 | (2006.01) |
| C30B 25/14 | (2006.01) |
| C30B 29/16 | (2006.01) |

(52) U.S. Cl.
CPC .......... C23C 16/4486 (2013.01); C01G 15/00 (2013.01); C23C 16/40 (2013.01); C30B 25/14 (2013.01); C30B 29/16 (2013.01)

(58) Field of Classification Search
CPC ......... C30B 29/16; C30B 25/02; C01G 15/00; C23C 16/448; H01L 21/365; H01L 21/368
See application file for complete search history.

(56) References Cited

FOREIGN PATENT DOCUMENTS

| | | |
|---|---|---|
| CN | 106809871 A | 6/2017 |
| JP | H10-338522 A | 12/1998 |
| JP | 2009-29694 A | 2/2009 |
| JP | 2014-19590 A | 2/2014 |

(Continued)

OTHER PUBLICATIONS

European Patent Office, English computer translation of JP 2018070422 (Year: 2024).*

(Continued)

*Primary Examiner* — Matthew J Song
(74) *Attorney, Agent, or Firm* — Oliff PLC

(57) ABSTRACT

A method for producing a gallium precursor, including, a step of preparing a solvent comprising an aqueous solution containing an acid and/or an alkali, a step of immersing gallium in the solvent, a step of making the gallium immersed in the solvent fine, and a step of dissolving the fined gallium. This provides a method for producing a gallium precursor with high quality and highly productive.

13 Claims, 1 Drawing Sheet

(56) References Cited

FOREIGN PATENT DOCUMENTS

| JP | 2014-084270 | A |   | 5/2014  |             |
|----|-------------|---|---|---------|-------------|
| JP | 5793732     | B2|   | 10/2015 |             |
| JP | 2017-005147 | A |   | 1/2017  |             |
| JP | 2018-70422  | A |   | 5/2018  |             |
| JP | 2018070422  | A | * | 5/2018  | C30B 29/16  |
| JP | 2021-066633 | A |   | 4/2021  |             |
| TW | 1503418     | B | * | 10/2015 | C22B 58/00  |

OTHER PUBLICATIONS

European Patent Office, English computer translation of TW I503418B (Year: 2024).*

Oct. 24, 2023 Office Action issued in Japanese Patent Application No. 2022-175183.

Sep. 12, 2023 Examination Report issued in Indian Patent Application No. 202247021810.

Oct. 6, 2020 International Search Report issued in International Application No. PCT/JP2020/027420.

Apr. 26, 2022 International Preliminary Report on Patentability issued in Patent Application No. PCT/JP2020/027420.

Jul. 1, 26, 2023 extended Search Report issued in European Patent Application No. 20878229.2.

Jul. 5, 2022 Office Action issued in Japanese Patent Application No. 2019-193265.

Oct. 17, 2023 Office Action and Search Report issued in Chinese Patent Application No. 202080073090.0.

May 11, 2024 Office Action issued in Chinese Patent Application No. 202080073090.0 with partial translation.

Jul. 18, 2024 Office Action issued in Korean Application No. 2022-7012965.

Aug. 12, 2024 Decision of Refusal issued in Chinese Application No. 202080073090.0.

Li Henglong, Gu Songqing et al., "Technology Handbook of Aluminum Production first volume," Metallurgical Industry Press, 2011.

* cited by examiner

[FIG. 1]
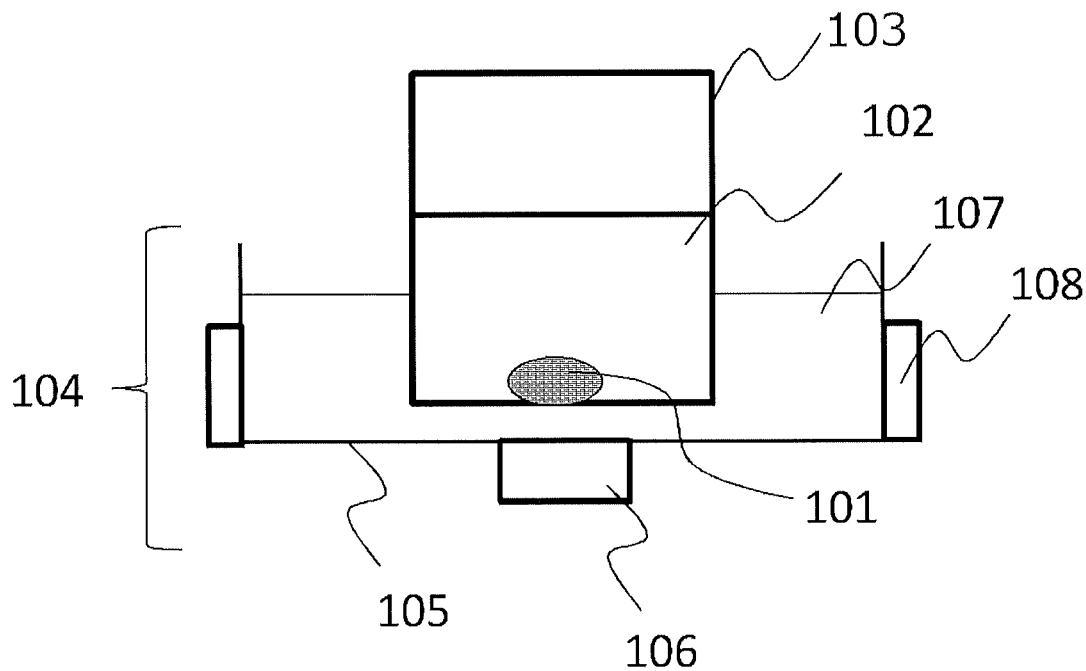
[FIG. 2]
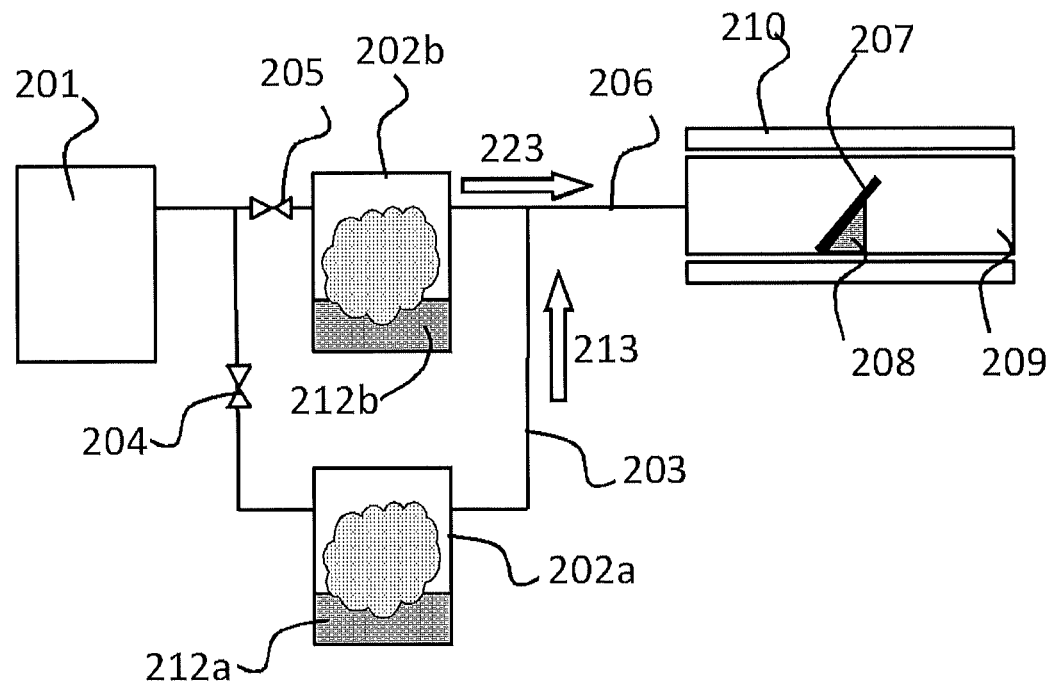

METHOD FOR PRODUCING GALLIUM PRECURSOR AND METHOD FOR PRODUCING LAMINATED BODY USING THE SAME

TECHNICAL FIELD

The present invention relates to a method for producing a gallium precursor useful for producing a laminated body including a gallium-containing film, and a method for producing a laminated body using the same.

BACKGROUND ART

As a method capable of forming an epitaxial film at low temperature and atmospheric pressure, a film forming method using particles of water fine, such as a mist CVD method, is known.

In Patent Document 1, gallium acetylacetonate is dissolved in an acid, such as hydrochloric acid, to form a precursor, and the precursor is atomized to generate raw material fine particles, and a gas mixture of the raw material fine particles and a carrier gas is supplied to a surface of a substrate having a corundum structure like sapphire, the reaction of the raw material mist is caused, and thereby a thin film of unidirectionally-oriented gallium oxide is epitaxially grown on the substrate.

Further, in Patent Document 2, a method using an aqueous solution of gallium halide obtained by dissolving gallium with hydrochloric acid, hydrobromic acid, hydrofluoric acid, hydroiodic acid or the like for about 1 to 2 weeks is disclosed.

CITATION LIST

Patent Literature

Patent Document 1: Japanese Patent No. 5793732
Patent Document 2: JP 2018-070422 A

SUMMARY OF INVENTION

Technical Problem

However, since the method of the Patent Document 1 uses an organic complex as a precursor, carbon concentration of the obtained film is high, and a high-quality film cannot be obtained.

Further, the method described in the Patent Document 2 is not suitable for practical use because it takes a long time to dissolve gallium.

The present invention has been made in view of the above problems, and it is an object of the present invention to provide a method for producing a gallium precursor with high productivity by shortening the time required for dissolving gallium in the precursor production, the method making it possible to the production of a high-quality film having a suppressed the carbon concentration in the obtained film because an organic complex is not used for the production of precursor.

Solution to Problem

In order to achieve the above object, the present invention provides a method for producing a gallium precursor comprising: a step of preparing a solvent comprising an aqueous solution containing an acid and/or an alkali, a step of immersing gallium in the solvent, a step of making the gallium immersed in the solvent fine, and a step of dissolving the fined gallium.

With such a production method of gallium precursor, gallium can be dissolved in a short time, and the gallium precursor that does not use an organic complex can be produced with high productivity.

At this time, the step of making the gallium fine may be performed by ultrasonic vibration.

By doing so, the refinement of the gallium can be facilitated, and the dissolution of the gallium can be further promoted.

At this time, the gallium can be further liquefied before the step of making the gallium fine.

By doing so, the dissolution time of the gallium can be further shortened.

At this time, it is preferable that the temperature of the solvent is kept at a temperature of 30° C. or higher and lower than 100° C. in the step of dissolving the gallium.

In this way, the dissolution of the gallium can be further promoted.

At this time, hydrogen halide may be used as the acid, and ammonia may be used as the alkali.

In this way, the gallium precursor can be made highly pure.

Further, the present invention provides a method for producing a laminated body containing a film containing gallium comprising: a step of heating a substrate, a step of further diluting the gallium precursor prepared by the method described above with water to prepare a gallium precursor solution, a step of atomizing the gallium precursor solution, a step of supplying the atomized gallium precursor solution to the substrate with a carrier gas, and a step of forming a film containing gallium on the substrate by reacting the atomized gallium precursor solution on the substrate.

By doing so, it is possible to obtain a high-quality laminated body with few impurities with high productivity.

Advantageous Effects of Invention

According to the gallium precursor production method of the present invention, a high quality gallium precursor can be produced with high productivity.

Further, according to the film forming method using the gallium precursor producing method of the present invention, a laminated body including a high-quality gallium containing film with few impurities can be produced easily and at low cost.

BRIEF DESCRIPTION OF DRAWINGS

FIG. 1 is a diagram showing one embodiment of a method for producing a gallium precursor according to the present invention.

FIG. 2 is a diagram showing one embodiment of a film forming method according to the present invention.

DESCRIPTION OF EMBODIMENTS

As described above, there has been a demand for a method for producing a high-quality film having a suppressed carbon concentration and a method for producing a gallium precursor used for producing a film with high productivity.

As a result of diligent studies to solve the above problems, the present inventor has found a method for producing a gallium precursor with high productivity that can suppress the carbon concentration in the obtained film and produce a high-quality film by not using an organic complex in the precursor production and can be shortened the time required for dissolving gallium at the time of producing the precursor, and reached the present invention.

That is, the present invention provides a method for producing a gallium precursor comprising: a step of preparing a solvent comprising an aqueous solution containing an acid and/or an alkali, a step of immersing gallium in the solvent, a step of making the gallium immersed in the solvent fine, and a step of dissolving the fined gallium.

According to the gallium precursor production method of the present invention, a high quality gallium precursor can be produced with high productivity. Further, according to the film forming method using the gallium precursor producing method of the present invention, a laminated body including a high-quality gallium-containing film with few impurities can be produced easily and at low cost.

Hereinafter, the present invention will be described in detail with reference to FIGS. 1 and 2, but the present invention is not limited thereto.

The gallium precursor according to the present invention is a solution in which gallium is dissolved in a solvent comprising an aqueous solution containing an acid and/or an alkali.

The method for producing a gallium precursor of the present invention includes a step of making the gallium immersed in the solvent fine, and a step of dissolving the fined gallium. The method of refinement is not particularly limited, but it is preferable to perform refinement by ultrasonic vibration.

As shown in FIG. 1, first, a container 103 containing gallium 101 and a solvent 102 containing at least one of an acid or an alkali is installed in the ultrasonic generator 104. The ultrasonic generator 104 includes, for example, a water bath 105, a vibrator 106, a medium 107, and a heating means 108. Either the gallium 101 or the solvent 102 may be put into the container 103 first.

The gallium 101 is preferably liquefied before the step of refinement. This further facilitates the refinement of gallium 101.

However, when weighing gallium, when liquefied gallium is used, the wettability of gallium is very strong, so it is preferable to put gallium directly in the container 103 before putting the solvent 102, not in another container.

The frequency of the ultrasonic wave generated from the vibrator 106 is not limited as long as the gallium 101 can be made fine, but is preferably 20 kHz or more and 1000 kHz or less, for example. As a result, the gallium 101 is made fine to have a diameter in millimeters or micrometers and the surface area is increased, so that a chemical reaction on the gallium surface is promoted and it is efficiently dissolved.

Further, the medium 107 propagates the ultrasonic waves generated from the vibrator 106 and transmits them to the solvent 102 and the gallium 101 in the container 103, and it is preferable to use water. The chemical reaction between the solvent 102 and the gallium 101 can further promoted by keeping the medium 107 at the temperature from 30° C. to 100° C., more preferably, from 30° C. to 60° C. with heating means 108, and the gallium 101 can be dissolved more efficiently.

When an acid is used as the solvent 102, it is preferable to use hydrohalic acid, the acid is more preferably hydrochloric acid, hydrobromic acid or hydroiodic acid, and the acid is most preferably hydroiodic acid. When hydroiodic acid is used, for example, 1 to 12 N (concentration 55 to 58%) of hydroiodic acid can be used, and this may be used as it is or diluted with pure water.

When an alkali is used as the solvent, it is preferable to use ammonia, and for example, ammonium hydroxide can be used. In this case, for example, ammonium hydroxide having a concentration of 1 to 12 N (concentration 28 to 40%) can be used, and this may be used as it is or diluted with pure water.

Further, the acid and the alkali can be mixed with each other and pH of the solvent 102 can be appropriately adjusted before use.

By completely dissolving the gallium 101 in this way, a gallium precursor is obtained.

The gallium concentration in the gallium precursor can be adjusted according to the purpose, but from the viewpoint of productivity, it is preferably 0.1 mol/L to 5 mol/L, and is more preferably about 1 mol/L to 3.5 mol/L.

Next, an example of a method for producing a laminated body containing a gallium-containing film using the gallium precursor produced by the above production method will be described with reference to FIG. 2, but the present invention is not limited thereto.

FIG. 2 shows an example of an apparatus used in the method for producing a laminated body according to the present invention. In the method for producing a laminated body according to the present invention, a mist CVD apparatus 200 is used. The mist CVD apparatus 200 includes a carrier gas 201, an atomizer 202a, an atomizer 202b, a transfer pipe 203, a valve 204, a valve 205, a transfer pipe 206, a substrate 207, a susceptor 208, a film-forming chamber 209, and a heating means 210.

First, the atomizers 202a and 202b contain the first precursor solution 212a and the second precursor solution 212b as a raw material, respectively. The raw material is subjected to atomization (also referred to as "mist formation") the raw material using known means, and mist is formed. The mist in the present invention refers to fine particles of a liquid dispersed in a gas, includes what is called a fog or a droplet, and may be referred to as a fog or a droplet.

For at least one of the first precursor solution 212a and the second precursor solution 212b, a precursor solution obtained by appropriately adjusting the concentration of the gallium precursor obtained by the above-mentioned method for producing a gallium precursor with pure water is used.

The gallium concentration in the precursor solutions 212a and 212b is not particularly limited and can be appropriately set according to the purpose and specifications. It is preferably 0.001 mol/L or more to 2 mol/L, and more preferably 0.01 mol/L or more and 0.7 mol/L or less.

Further, the components of the first precursor solution 212a and the second precursor solution 212b may be the same as or different from each other. For example, in case of forming a binary oxide of gallium and aluminum, the gallium precursor solution can be used as the first precursor solution 212a, and the aluminum precursor solution can be used as the second precursor solution 212b.

Further, impurities may be added to the precursor solutions 212a and 212b. For example, when forming gallium oxide, n-type dopants such as tin, germanium, silicon, titanium, zirconium, vanadium or niobium, or p-type dopants such as copper, silver, tin, iridium or rhodium can be mentioned. Complexes and compounds containing these can be preferably used, and tin halide is particularly preferable.

The raw material of impurity can be used at a ratio of 0.0001% to 20%, more preferably 0.001% to 10%, based on the gallium concentration of the precursor solution. Further, these impurities may be mixed with the gallium precursor solution and used, or the gallium precursor solution may be prepared as the first precursor solution 212a and, apart from this, the impurity solution may be prepared as the second precursor solution 212b, and the first and second precursors in the form of mist may be mixed with each other.

The atomizing means for the precursor solutions 212a and 212b is not particularly limited as long as it can be atomized or dropletized, and may be a known means, but in the present invention, the atomizing means using ultrasonic wave is preferable.

Fog or droplets obtained using ultrasonic wave are preferable because they have a zero initial velocity and float in the air. For example, instead of spraying like a spray, they float in space and can be transferred as gas. It is very suitable because it is not damaged by collision energy.

The droplet size is not particularly limited and may be a droplet of about several mm, but is preferably 50 μm or less, and more preferably 0.1 to 10 μm.

The carrier gas 201 is mixed with the atomized raw material (precursor solution) formed in the atomizers 202a and 202b to become the first gas mixture 213 and the second gas mixture 223, respectively, and are transferred to the film-forming chamber 209.

The gas mixture supplied to the film-forming chamber 209 reacts in the film-forming chamber 209 on the substrate 207 heated by the heating means 210 to form a film.

In the example shown in FIG. 2, a structure is shown in which the atomizer 202b and the film-forming chamber 209 are connected by a transfer pipe 206, and the transfer pipe 203 from the atomizer 202a joins in the middle of the transfer pipe 206. However, the transfer pipe 203 and the transfer pipe 206 may be independently connected to the film-forming chamber 209. Further, the present invention is not limited to this, and the first gas mixture 213 and the second gas mixture 223 may be introduced into a single buffer tank (not shown), and the mist mixed in the buffer tank may be transferred to the film-forming chamber 209.

The carrier gas 201 is not particularly limited, and for example, air, oxygen or ozone, or, other than these, an inert gas such as nitrogen, argon or the like, or a reducing gas such as hydrogen gas, forming gas or the like can be preferably used. The type of carrier gas may be one type or two or more types.

The flow rate of the carrier gas may be appropriately set depending on the size of the substrate and the size of the film-forming chamber, and can be set to about 0.01 to 100 L/min.

Further, the film formation may be carried out under any conditions of atmospheric pressure, pressurized or reduced pressure, but it is preferably carried out under atmospheric pressure in terms of equipment cost and productivity.

Although not shown, it is also possible to add a diluent gas to adjust the ratio of atomized precursor solution to carrier gas. The flow rate of the diluent gas may be appropriately set, and may be, for example, 0.1 to 10 times/min of the carrier gas.

The diluent gas may be supplied to, for example, the downstream side of the atomizers 202a and 202b. Further, as the diluent gas, the same gas as the carrier gas may be used, or a different gas may be used.

The transfer pipes 203 and 206 are not particularly limited as long as they have sufficient stability with respect to the solvent of the precursor and the temperature at the connection between the reactor and the transfer pipe, quartz pipes, or general resin pipes such as polyethylene, polypropylene, vinyl chloride, silicone resin, urethane resin, and fluororesin can be widely used.

The structure of the film-forming chamber 209 is not particularly limited, and metals such as aluminum and stainless steel may be used, and quartz or silicon carbide may be used when the film is formed at a higher temperature exceeding the heat resistant temperature of these metals. A heating means 210 for heating the substrate 207 is provided inside or outside the film-forming chamber 209. Further, the substrate 207 may be placed on the susceptor 208 installed in the film-forming chamber 209.

The substrate is not particularly limited as long as it can support the film to be formed. Material of the substrate may be a known material, and may be an organic compound, or may be an inorganic compound. For example, polysulfone, polyethersulfone, polyphenylene sulfide, polyetheretherketone, polyimide, polyetherimide, fluororesin, iron, aluminum, stainless steel, gold and other metals, silicon, sapphire, quartz, glass, calcium carbonate, gallium oxide, SiC, ZnO, GaN or the like can be mentioned but are not limited thereto.

The shape of the substrate may be, for example, plate-like such as a flat plate or a disk, fibrous, rod-like, columnar, prismatic, tubular, spiral, spherical, ring-shaped, or the like. In particular, when the substrate is a plate-like body, the thickness thereof is not particularly limited in the present invention, but is preferably 50 to 2000 μm, and more preferably 200 to 800 μm.

In the present invention, it is also preferable that the substrate is a substrate containing a crystal having a corundum structure as a main component or a substrate containing a crystal having a β-gallia structure as a main component. Here, the main component refers to the component having a content of 50% or more.

Examples of the substrate containing a crystal having a corundum structure as a main component include sapphire (eg: c-plane sapphire substrate) and α-type gallium oxide.

Examples of the substrate containing a crystal having a β-gallia structure as a main component include a β-$Ga_2O_3$ substrate or a mixed crystal substrate containing $Ga_2O_3$ and $Al_2O_3$ and having $Al_2O_3$ in an amount of more than 0% by mass and 60% by mass or less. Examples thereof include a substrate in which β-$Ga_2O_3$ is formed on a known substrate.

Examples of other substrates include substrates having a hexagonal structure (eg: SiC, ZnO, GaN, $LiTaO_3$) or the like. A film may be formed on the substrate having a hexagonal structure directly or via another layer (eg: a buffer layer).

EXAMPLE

Hereinafter, the present invention will be specifically described with reference to Examples and Comparative Examples, but the present invention is not limited thereto.

Example 1

20 g of liquefied gallium was weighed in a beaker made of borosilicate glass, and 145 mL of hydroiodic acid having a concentration of 56.3% was added thereto. This was installed in an ultrasonic generator kept at a water temperature of 40° C., and gallium was vibrated and made fine by ultrasonic waves having a frequency of 38 kHz. The gallium was left in this state until it was completely dissolved to prepare a 2 mol/L gallium precursor.

The time required for dissolution was measured and found to be 2 hours and 40 minutes.

Comparative Example 1

A gallium precursor was prepared in the same manner as in Example 1 except that ultrasonic vibration was not applied to gallium. The time required for dissolution was measured and found to be 276 hours.

As a result of Example 1, the time required for producing the gallium precursor was significantly shortened as compared with Comparative Example 1.

Example 2

A gallium oxide film was formed under the following conditions using a mist CVD apparatus. First, the gallium precursor prepared in Example 1 was diluted with pure water to form a 0.05 mol/L precursor solution as a raw material solution, and the raw material solution was filled in an atomizer.

Next, a c-plane sapphire substrate having a diameter of 4 inches (100 mm) and a thickness of 0.6 mm was placed on a quartz susceptor and installed in a quartz tubular film-forming chamber, and the temperature of the c-plane sapphire substrate was keep at 450° C. by a heater.

Next, the raw material solution in the atomizer was atomized with a 2.4 MHz ultrasonic vibrator. After that, nitrogen as the carrier gas is introduced into the atomizer at 1.5 L/min and nitrogen as the diluent gas is introduced at 5 L/min to form an gas mixture, which is supplied to the film-forming chamber to form a film.

The crystallinity and carbon concentration of the obtained film were evaluated by the XRD method and the SIMS method, respectively.

Comparative Example 2

The film formation and the film evaluation were performed in the same manner as in Example 2 except that gallium acetylacetonate was dissolved in a dilute aqueous hydrochloric acid solution (hydrochloric acid concentration 2%) to prepare a precursor solution of 0.05 mol/L.

Table 1 shows the evaluation results of Example 2 and Comparative Example 2. In each case, the formed film was $\alpha$-$Ga_2O_3$, but the results of Example 2 showed that the half-value width of the locking curve was improved and the impurity concentration was significantly reduced as compared with Comparative Example 2.

TABLE 1

|  | Formed film | Half-value width of locking curve [seconds] | Carbon concentration [atoms/cm$^3$] |
| --- | --- | --- | --- |
| Example 2 | $\alpha$-$Ga_2O_3$ | 10.5 | Not detected |
| Comparative Example 2 | $\alpha$-$Ga_2O_3$ | 32.3 | $3.6 \times 10^{20}$ |

From the above results, it was found that, according to the present invention, the productivity of the gallium precursor could be significantly improved as compared with the prior art, and when the gallium precursor obtained by the method of the present invention was used, a higher quality film was obtained than that of the prior art.

It should be noted that the present invention is not limited to the above embodiment. The embodiments are just examples, and any examples that substantially have the same feature and demonstrate the same functions and effects as those in the technical concept disclosed in claims of the present invention are included in the technical scope of the present invention.

The invention claimed is:

1. A method for producing a gallium precursor comprising:
a step of preparing a solvent consisting of water and an alkali, a step of immersing gallium in the solvent, a step of making the gallium immersed in the solvent fine, and a step of dissolving the fine gallium.

2. The method for producing a gallium precursor according to claim 1, wherein the step of making the gallium fine is to make the gallium fine by ultrasonic vibration.

3. The method for producing a gallium precursor according to claim 2, further comprising liquefying the gallium before the step of making the gallium fine.

4. The method for producing a gallium precursor according to claim 3, wherein the temperature of the solvent is kept at 30° C. or higher and lower than 100° C. in the step of dissolving the gallium.

5. The method for producing a gallium precursor according to claim 3, wherein ammonia is used as the alkali.

6. The method for producing a gallium precursor according to claim 2, wherein the temperature of the solvent is kept at 30° C. or higher and lower than 100° C. in the step of dissolving the gallium.

7. The method for producing a gallium precursor according to claim 2, wherein ammonia is used as the alkali.

8. The method for producing a gallium precursor according to claim 1, further comprising liquefying the gallium before the step of making the gallium fine.

9. The method for producing a gallium precursor according to claim 8, wherein the temperature of the solvent is kept at 30° C. or higher and lower than 100° C. in the step of dissolving the gallium.

10. The method for producing a gallium precursor according to claim 8, wherein ammonia is used as the alkali.

11. The method for producing a gallium precursor according to claim 1, wherein the temperature of the solvent is kept at 30° C. or higher and lower than 100° C. in the step of dissolving the gallium.

12. The method for producing a gallium precursor according to claim 1, wherein ammonia is used as the alkali.

13. A method for producing a laminated body containing a film containing gallium comprising:
a step of heating a substrate, a step of further diluting the gallium precursor prepared by the method according to claim 8 with water to prepare a gallium precursor solution, a step of atomizing the gallium precursor solution, a step of supplying the atomized gallium precursor solution to the substrate with a carrier gas, and a step of forming a film containing gallium on the substrate by reacting the atomized gallium precursor solution on the substrate.

* * * * *